United States Patent
Malajovich

(10) Patent No.: US 7,105,462 B2
(45) Date of Patent: Sep. 12, 2006

(54) LAMINATION OF ORGANIC SEMICONDUCTOR

(75) Inventor: Irina Malajovich, Swartmore, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/895,599

(22) Filed: Jul. 21, 2004

(65) Prior Publication Data

US 2005/0035374 A1 Feb. 17, 2005

Related U.S. Application Data

(60) Provisional application No. 60/501,687, filed on Sep. 10, 2003, provisional application No. 60/489,330, filed on Jul. 22, 2003.

(51) Int. Cl.
- *H01L 21/31* (2006.01)
- *B41M 3/12* (2006.01)
- *H01L 23/58* (2006.01)

(52) U.S. Cl. .............. 438/780; 427/146; 156/230; 156/540; 257/40; 257/642; 257/E39.007; 257/E51.001

(58) Field of Classification Search .......... 438/725, 438/780; 156/230, 540; 427/58, 66, 146, 427/152; 428/914
See application file for complete search history.

(56) References Cited

U.S. PATENT DOCUMENTS

| | | | |
|---|---|---|---|
| 6,197,663 B1 | 3/2001 | Chandross et al. | |
| 6,335,263 B1 * | 1/2002 | Cheung et al. | 438/455 |
| 6,852,355 B1 * | 2/2005 | Blanchet-Fincher | 427/58 |
| 2002/0160296 A1 | 10/2002 | Wolk et al. | |
| 2004/0108047 A1 * | 6/2004 | Afzali-Ardakani et al. | 156/230 |

FOREIGN PATENT DOCUMENTS

| | | |
|---|---|---|
| EP | 1237207 | 9/2002 |
| JP | 2002236286 | 8/2002 |
| WO | WO 02/070271 | 9/2002 |

OTHER PUBLICATIONS

PCT/US2004/023375, International Search Report dated Jan. 12, 2005.

* cited by examiner

Primary Examiner—David Nelms
Assistant Examiner—Long Tran

(57) ABSTRACT

Low temperature, ambient pressure processes are desired for fabrication of transistors on flexible polymer substrates. Lamination of semiconductors is such a process. The semiconductor is deposited on a donor substrate. The donor is positioned over a receiver substrate, which may be patterned with additional transistor elements. The semiconductor is transferred from the donor to the receiver by lamination.

3 Claims, 6 Drawing Sheets

LAMINATION OF ORGANIC SEMICONDUCTOR

FIELD OF THE INVENTION

The present invention relates to a process for the fabrication of thin film electronic devices in which the semiconductor portion of the device is deposited by lamination from a donor substrate on to a receiver substrate. The donor or the substrate may include other elements of the device, such as conductors or dielectrics. This dry lamination process is useful for fabricating devices such as transistors or light-emitting devices on flexible, polymer substrates, which require low temperature fabrication processes.

TECHNICAL BACKGROUND

Most active electronics today is done using silicon integrated circuit (IC) technology on crystalline or on other hard surfaces. In recent years, lower cost paths than silicon IC processes have been emerging. Thin film transistors can be fabricated with low-cost flexible plastics as a substrate using low temperature processes. Combining flexible substrates with low cost continuous printing methods is a goal that would allow for the production of inexpensive or large applications that IC silicon technology cannot deliver. Examples of products that would benefit with low cost flexible electronics are disposable tags, sensors or flexible displays. The use of polymer substrates dictates that the thin film transistor fabrication processes operate at low temperature. Additionally, it is desired that transistor fabrication processes operate at ambient pressure so that large areas of polymer substrate can be processed without introduction into a vacuum chamber.

Japanese Patent 2002236286 discloses a colored organic film used as a layer insulation membrane, which is laminated. U.S. Pat. No. 6,197,663 discloses a thin film transistor formed by laminating two substrates together. An interconnect structure is transferred during the lamination. An organic semiconductor is not transferred. In contrast, the present invention describes a process where the semiconductor of a thin film device is transferred to a substrate by lamination as defined herein.

SUMMARY OF THE INVENTION

The present invention concerns a process comprising:
a) depositing an organic semiconductor on a donor substrate;
b) laminating the organic semiconductor on the donor substrate with a receiver substrate; and
c) removing the donor substrate.

The present invention also includes the above process where the receiver substrate is a flexible polymer.

The present invention further describes an electronic device comprising a semiconductor laminated on a receiver substrate.

The present invention further describes an electronic device comprising a semiconductor laminated on a receiver substrate where the electronic device is a transistor.

The present invention also includes the transistor described above where the substrate is a flexible polymer.

DETAILED DESCRIPTION

Figure 1:
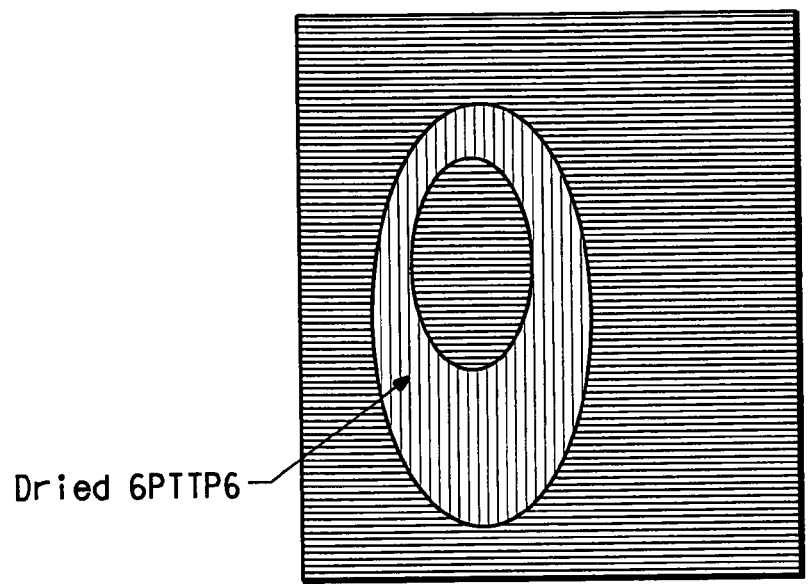
FIG. 1 illustrates an organic polymer semiconductor deposited on a donor sheet.

A thin film field effect transistor herein consists of a semiconductor material between a source and a drain electrode. The source and the drain electrodes and the semiconductor are electrically insulated from a third, gate, electrode by a dielectric layer. Numerous low temperature printing processes have been developed to apply the conductive electrodes to polymer substrates. These include lithography, laser printing, micro contact printing and ink jet printing. The objective of the present invention is to provide a low temperature, ambient pressure method of depositing a semiconductor during the fabrication of a thin film transistor.

In the present invention, organic semiconductors such as pentacene, alpha, alpha'-bis-4 (n-hexyl)phenyl bitiophene or polythiophene can be deposited on a flexible donor substrate. The donor substrate is the material on which the semiconductor is initially deposited prior to lamination with the desired receiver substrate. The receiver substrate is frequently patterned with other elements of an electronic device such as sources and drains of a field effect transistor. Deposition can be accomplished through evaporation, spin casting or drop casting. Evaporation of the semiconductor on to the donor substrate may be performed in a vacuum chamber. Spin casting or drop casting involve the dissolution of the semiconductor in a solvent, application of the resulting solution to the donor substrate, and evaporation of the solvent, leaving a film of semiconductor on the donor substrate. The donor substrate may be sheets of Teflon, Mylar, Kapton, or similar materials. Some donor substrates may contain additional intermediate layers to facilitate the semiconductor film formation or release, or to improve the conformal coverage of the receiver substrate.

After semiconductor deposition on the donor substrate, the donor substrate is positioned relative to the flexible polymer substrate with the semiconductor deposit situated between the flexible polymer substrate and the transfer substrate. At this point, the receiver substrate may be already patterned with other elements of the thin film transistor. Two arrangements are particularly convenient. In the first arrangement, the gate electrode may be deposited directly on the flexible polymer substrate and then covered with a dielectric layer. The organic polymer semiconductor is then laminated over the dielectric. By lamination, it is meant that a layer of transferable material deposited on a donor substrate will be pressed against a receiver substrate at a desired temperature such that the transferable material adheres to the receiver substrate. There is no motion of the donor substrate in the plane of contact with the receiver substrate. Finally, the source and drain electrodes are deposited on the semiconductor layer. Alternatively, the source and drain may be deposited directly on the donor substrate. The semiconductor is then laminated over the source and drain. A dielectric layer is then deposited over the semiconductor and a gate electrode is deposited over the dielectric.

The semiconductor deposition via lamination presents several advantages over the direct deposition onto a substrate. In the case of solution deposition, applying the solvent on to a donor sheet first resolves all the chemical compatibility issues between different layers of the transistor, since by the time the semiconductor is ready for lamination, all the solvents have evaporated. This technique also allows for a preparation of a smaller size donor sheet that can be partitioned to cover a large area electronic panel. The latter feature of lamination can be critical when semiconductors need to be evaporated in a vacuum chamber: the size of the vacuum chamber does not limit the size of the electronic panel. Spin coating of large areas can also be challenging, and lamination again decouples the size of the donor and the size of the electronic circuits being built. It may also be possible to have a donor sheet that can withstand higher temperatures than the substrate, and thus semiconductor lamination opens up opportunities in flexible electronics to materials that require high temperature annealing, such as amorphous Si. Finally, the intermediate step of preparing a donor sheet allows for preparation of semiconductors in a different facility and at a different time than the final device, which can be a feature if solvents or vacuum chambers have different requirements than the semiconductor assembly facility.

EXAMPLES

Example 1

This example describes how to laminate a semiconductor by coating a donor with a drop of organic semiconductor solution.

Figure 2:
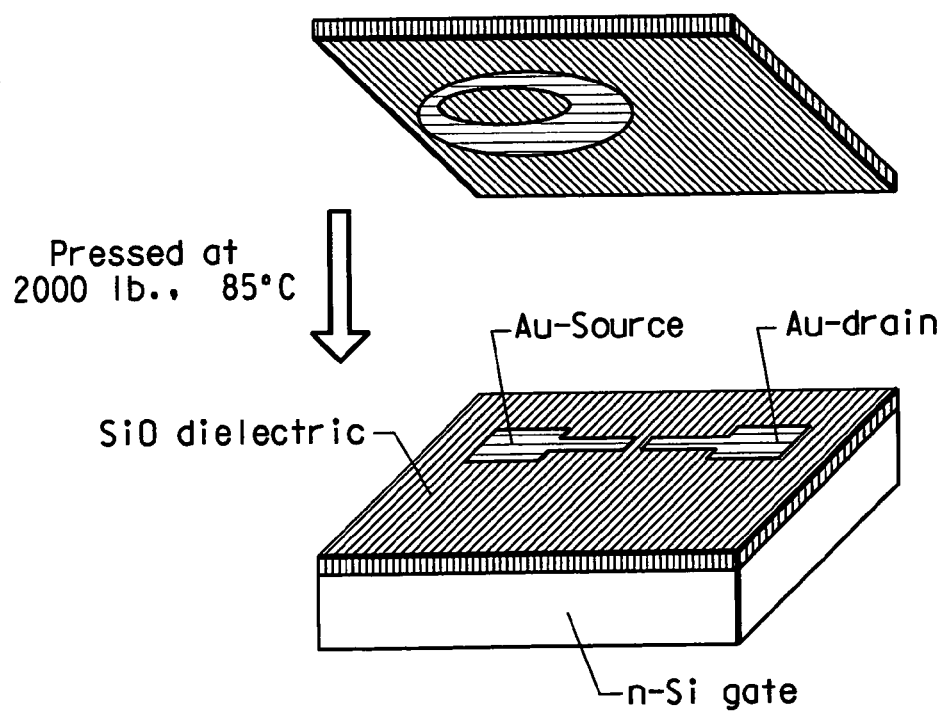
FIG. 2 depicts the donor sheet oriented for lamination with a substrate containing transistor elements.
Figure 3:
FIG. 3 shows a micrograph of a laminated organic polymer semiconductor on a substrate.

A sheet of Teflon paper 11 was placed on a 120° C. hot plate inside a glove box. A few drops of α, α'-bis-4-(n-hexyl) phenyl bitiophene (6PTTP6) semiconductor in chloroform were placed on the Teflon. The drops were allowed to dry in the hotplate for a few minutes, resulting in circular patterns of semiconductor with thicker edges where most of the solution agglomerated. After about 5 minutes the donor was removed from the hotplate and left at room temperature for 30 minutes. The drop of 6PTTP6 dried unevenly, leaving a ring pattern 10 as depicted in FIG. 1. The donor sheet 11 was then pressed in a laminator onto a Si wafer patterned with a gate electrode 15, dielectric 12, and source 13/drain 14 pair. The laminator press (not shown) consist of two iron plates which were warmed to 85° C. and pressed together with a force of 1 to 10 kilopounds. FIG. 2 illustrates the orientation of the donor substrate and the dried semiconductor relative to the electrode elements of a transister. The donor was then peeled-off. The semiconductor remained on the Si-wafer thereby completeing the transistor. A Micrograph of the device achieved using a"laminated semiconductor" is shown in FIG. 3.

Figure 4:
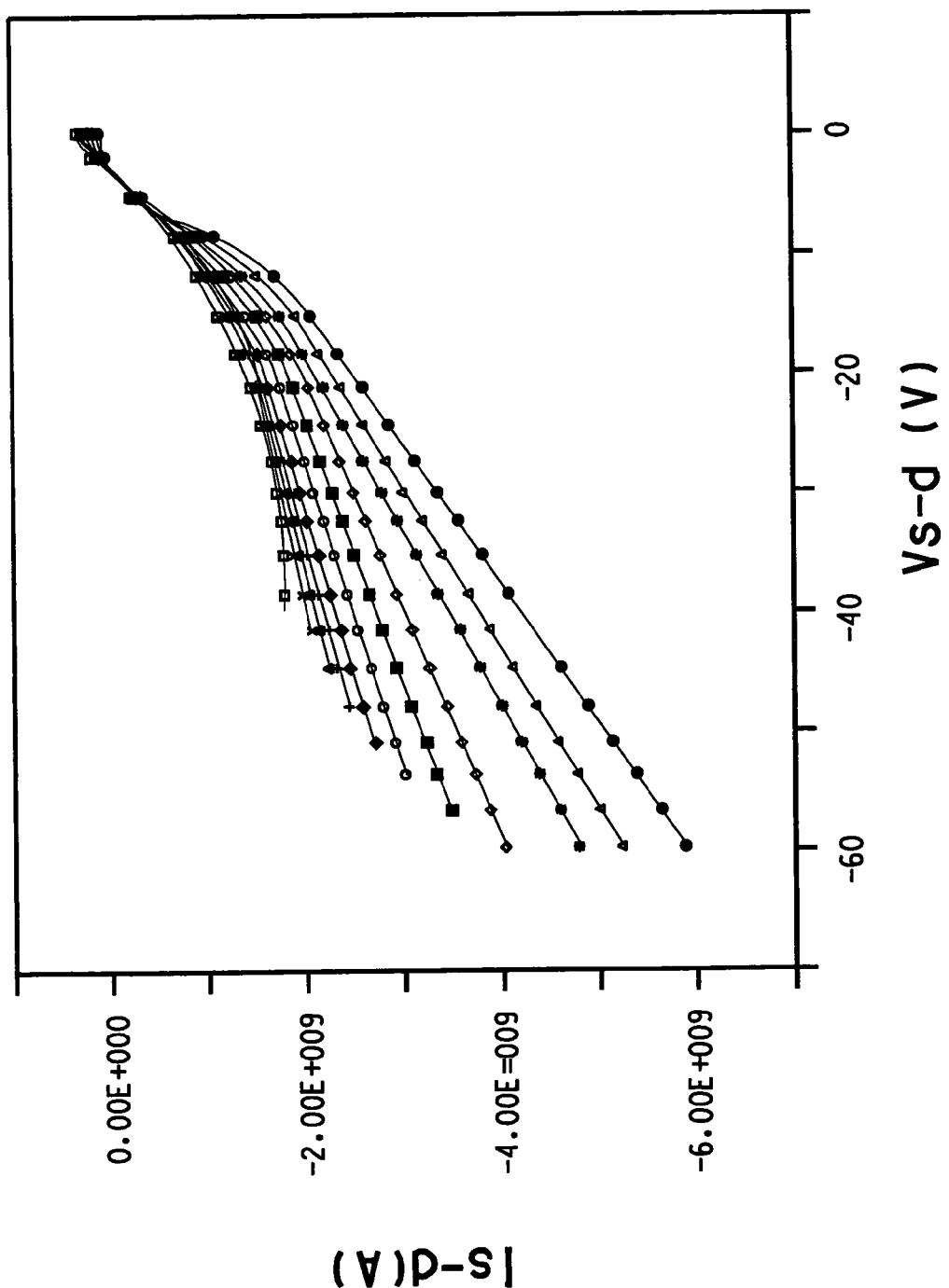
FIG. 4 shows the transistor characteristics of a transistor with a laminated organic semiconductor of $\alpha, \alpha'$-bis-4-(n-hexyl) phenyl bitiophene (6PTTP6).

The area surrounding the transistor was scratched to reduce the leakage. The sample current-voltage characteristic obtained from this device is shown as FIG. 4, where the gate voltage was swept from 0 to −60V. The resulting mobilities are ~$10^{-7}$ cm$^2$/Vs.

Example 2

Figure 5:
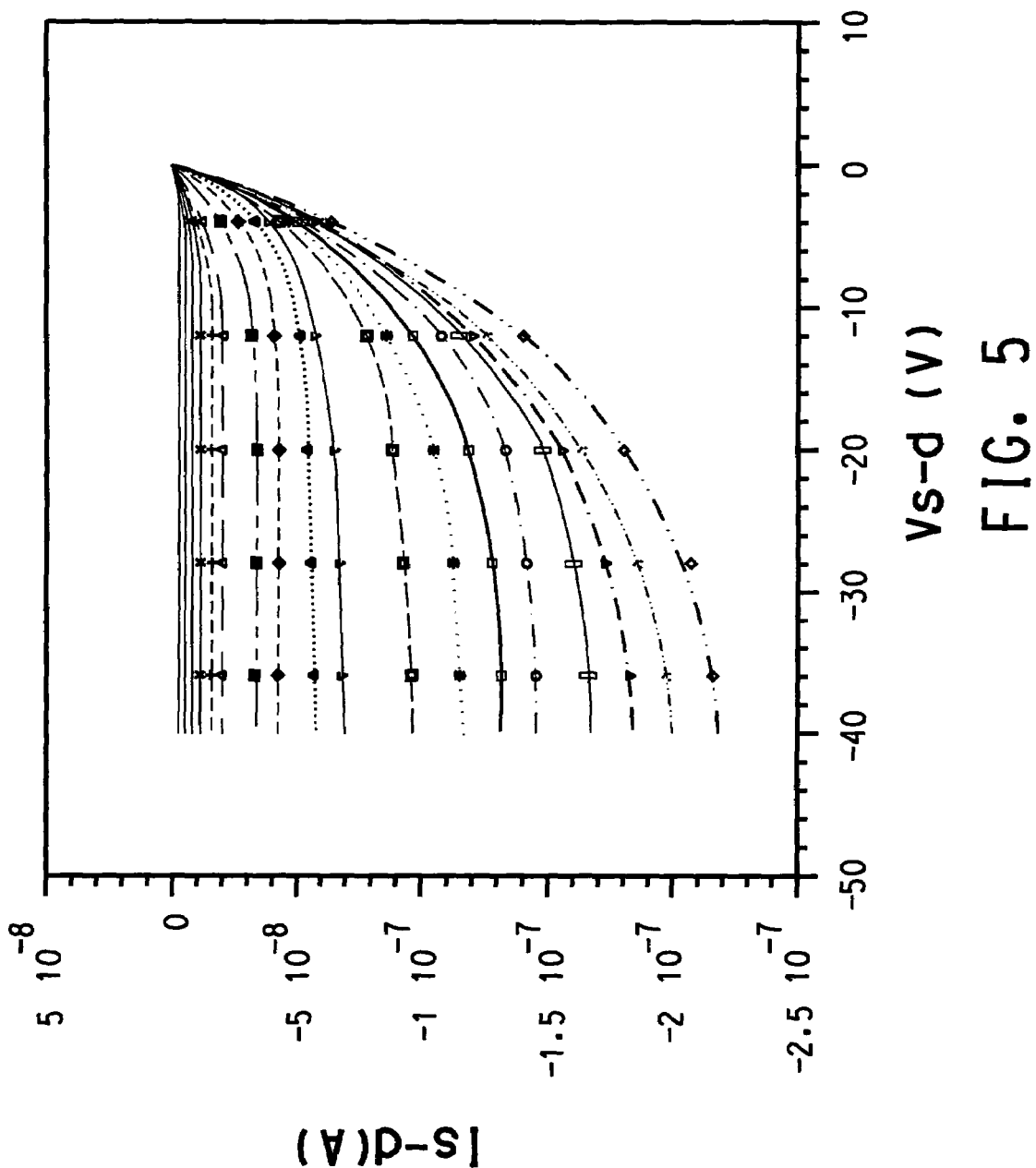
FIG. 5 shows the transistor characteristics of a transistor with a laminated organic polymer semiconductor of polythiophene.

This example describes the lamination of a semiconductor by spin-coating the semiconductor onto the donor sheet. A sample of polythiophene (Aldrich) dissolved in toluene was spin-coated onto a Mylar/Elvax/Cronar/Latex donor. The coating was done inside a glove-box, at room temperature and a speed of 1000 rpm for 1 minute. The coated donor was then laminated onto a Si-based gate/dielectric/source-drain structure, completing the transistor by the transfer of a semiconductor. The lamination was performed at 2 klb pressure at 85° C. During lamination, only the semiconductor was transferred from the donor sheet to the Si-chip. The resulting transistor had mobilities as high as $10^{-3}$ cm$^2$/Vs: The current voltage characteristics are shown in FIG. 5.

Example 3

Figure 6:
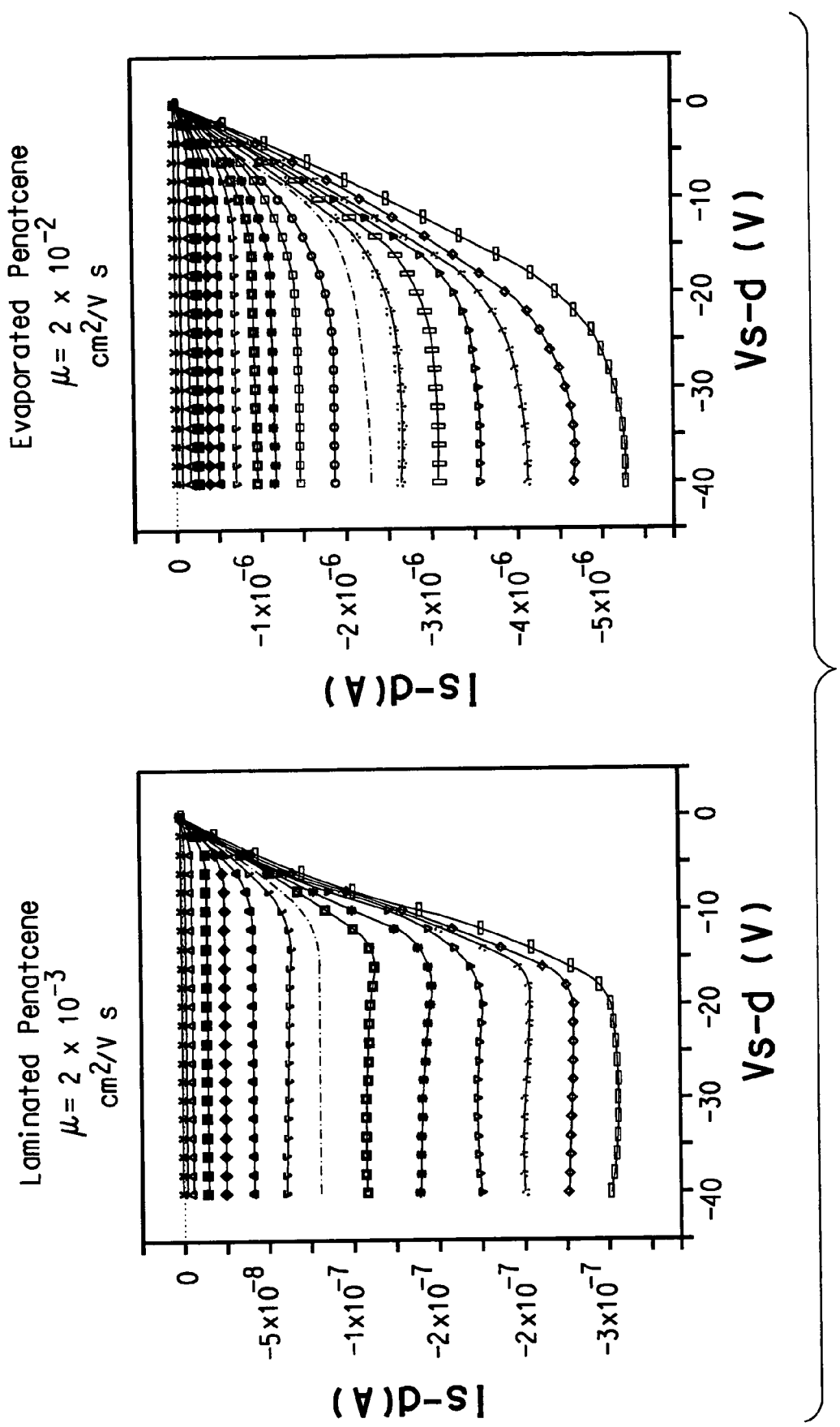
FIG. 6 compares the transistor characteristics of laminated and evaporated pentacene.
Figure 7:
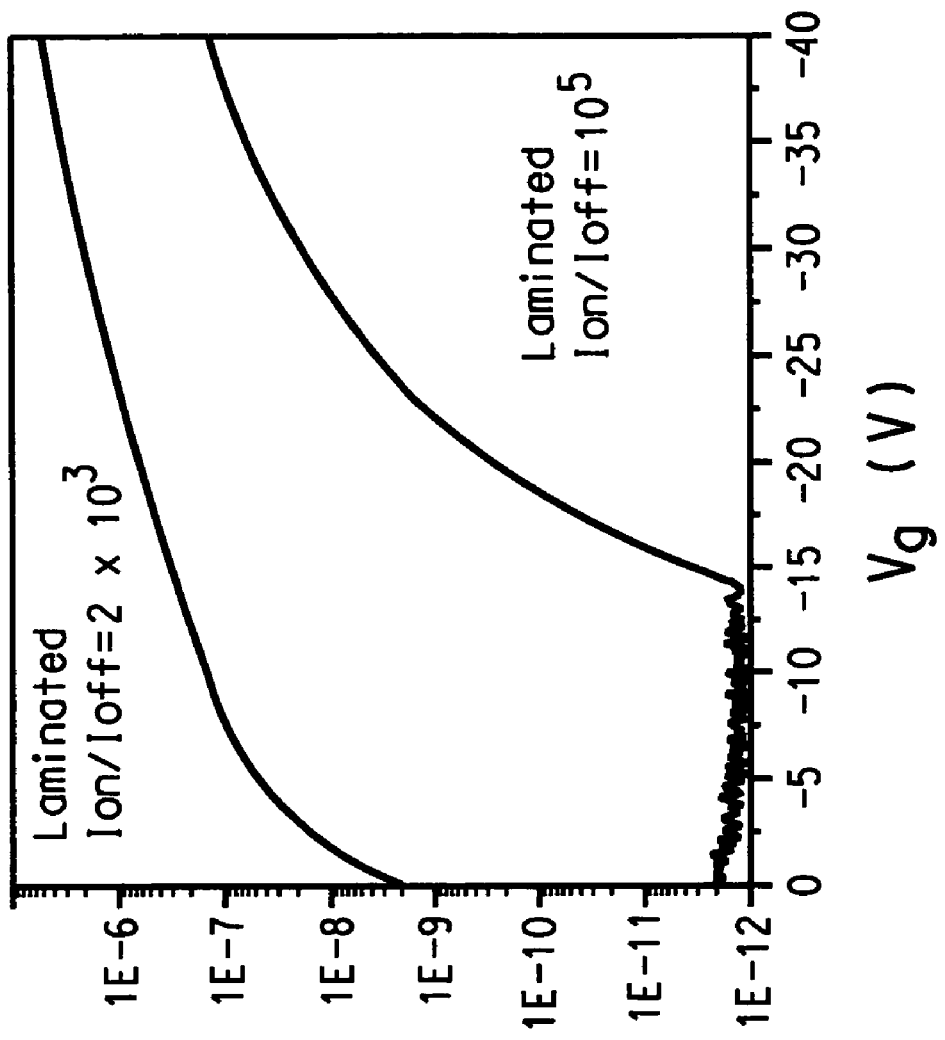
FIG. 7 further compares the transistor characteristics of laminated and evaporated pentacene.

This is an example of lamination of a semiconductor where the semiconductor donor was prepared by evaporation. A Mylar/Elvax/Latex donor sheet was placed in a thermal evaporator. Pentacene was evaporated at a pressure of $10^{-7}$ Torr at a rate of ~0.02 nm/sec. As a control, a Si-chip containing a gate/dielectic/source-drain structure was placed together with the donor sheet. Approximately 1200 nm of pentacene was deposited at room temperature. The donor sheet was laminated onto a Si-chip identical to the control sample, at 85° C. and 2 klb. The pentacene was transferred onto the chip but the dielectric (latex) was not. The results of the laminated pentacene as compared to the evaporated pentacene are shown as FIG. 6. The mobilities decreased with lamination as compared to evaporation. The threshold voltage increased, but the on/off ratios of the transistors remained the same or improved, as shown in FIG. 7. In FIG. 7, the evaporated pentacene is the upper curve. The on/off current ratio is 2×$10^3$. The lower curve of FIG. 7 is laminated pentacene. The on/off ration is $10^5$.

What is claimed is:

1. A process comprising:
   (a) dropping at least one drop of a solution comprising an organic semiconductor and at least one solvent on a donor substrate;
   (b) evaporating the solvent forming at least one dried drop;
   (c) laminating the donor substrate with a receiver substrate wherein the drop transfers to the receiver substrate; and
   (d) removing the donor substrate.

2. The process of claim 1 wherein the receiver substrate is a flexible polymer.

3. The process of claim 1 wherein the organic semiconductor is selected from pentacene, alpha, alpha'-bis-4(n-hexyl)phenyl bitiophene and polythiophene.

* * * * *